(12) United States Patent
Oh (10) Patent No.: US 8,786,326 B2
(45) Date of Patent: Jul. 22, 2014

(54) INTEGRATED CIRCUIT CHIP AND SYSTEM HAVING THE SAME

(71) Applicant: SK hynix Inc., Gyeonggi-do (KR)

(72) Inventor: Seung-Min Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/145,539

(22) Filed: Dec. 31, 2013

(65) Prior Publication Data

US 2014/0111255 A1  Apr. 24, 2014

Related U.S. Application Data

(62) Division of application No. 13/610,760, filed on Sep. 11, 2012, now Pat. No. 8,624,639.

(30) Foreign Application Priority Data

Oct. 25, 2011  (KR) ........................ 10-2011-0109344

(51) Int. Cl.
  *H03B 1/00*  (2006.01)
  *H03K 3/00*  (2006.01)

(52) U.S. Cl.
  USPC ........... 327/109; 327/108; 327/110; 327/111; 327/112

(58) Field of Classification Search
  USPC ................................................ 327/108–112
  See application file for complete search history.

(56) References Cited

U.S. PATENT DOCUMENTS

| | | | |
|---|---|---|---|
| 4,549,094 A * | 10/1985 | Floyd | 327/386 |
| 4,939,389 A * | 7/1990 | Cox et al. | 326/86 |
| 6,727,728 B1 * | 4/2004 | Bitting | 326/55 |
| 7,030,657 B2 * | 4/2006 | Stojanovic et al. | 326/87 |
| 7,176,721 B2 * | 2/2007 | Ho et al. | 326/82 |
| 7,199,615 B2 * | 4/2007 | Stojanovic et al. | 326/82 |
| 7,974,589 B2 * | 7/2011 | Jeffries et al. | 455/91 |
| 8,183,887 B2 * | 5/2012 | Stojanovic et al. | 326/87 |
| 8,432,768 B2 * | 4/2013 | Ware et al. | 365/233.1 |
| 2002/0019952 A1 * | 2/2002 | Ueno | 713/500 |
| 2003/0090292 A1 * | 5/2003 | Hidaka | 326/83 |
| 2004/0148482 A1 * | 7/2004 | Grundy et al. | 711/167 |
| 2010/0260055 A1 * | 10/2010 | Anderson et al. | 370/252 |
| 2010/0271092 A1 * | 10/2010 | Zerbe et al. | 327/161 |
| 2011/0235459 A1 * | 9/2011 | Ware et al. | 365/233.11 |
| 2011/0235763 A1 * | 9/2011 | Palmer et al. | 375/362 |
| 2011/0235764 A1 * | 9/2011 | Ware et al. | 375/362 |
| 2011/0239030 A1 * | 9/2011 | Ware et al. | 713/400 |
| 2011/0239031 A1 * | 9/2011 | Ware et al. | 713/500 |
| 2012/0063524 A1 * | 3/2012 | Stott et al. | 375/259 |
| 2012/0267089 A1 * | 10/2012 | Mucignat et al. | 165/201 |
| 2013/0099833 A1 * | 4/2013 | Oh | 327/115 |

* cited by examiner

*Primary Examiner* — Adam Houston
(74) *Attorney, Agent, or Firm* — IP & T Group LLP (57) ABSTRACT

An integrated circuit chip includes: an internal circuit; a data output circuit configured to output a data packet of the internal circuit in response to a strobe signal; an oscillator configured to generate a first clock signal; a divider configured to divide the first clock signal and generate a second clock signal; and a strobe signal supply unit configured to supply the second clock signal as the strobe signal during an initial period of transmission of the data packet and supply the first clock signal as the strobe signal after the initial period.

10 Claims, 8 Drawing Sheets

FIG. 9 ically higher data transmission rate is desired. However, as the transmission frequency of data increases, a data-eye for recognizing data may be gradually reduced.

INTEGRATED CIRCUIT CHIP AND SYSTEM HAVING THE SAME

CROSS-REFERENCE TO RELATED APPLICATIONS

This application is a division of U.S. patent application Ser. No. 13/610,760 filed on Sep. 11, 2012, which claims priority of Korean Patent Application No. 10-2011-0109344, filed on Oct. 25,2011. The disclosure of each of the foregoing application is incorporated herein by reference in its entirety.

BACKGROUND

1. Field

Exemplary embodiments of the present invention relate to data transmission between integrated circuit chips.

2. Description of the Related Art

Integrated circuit chips are often not stand-alone chips but chips that operate in dependence to other neighboring chips. For example, memory chips such as DRAM and Flash memories exchange data with a memory controller, and a CPU exchanges data with various chips on a mother board. With the development of technology, progressively higher data transmission rate is desired. However, as the transmission frequency of data increases, a data-eye for recognizing data may be gradually reduced.

According to an example, when a data packet is successively transmitted, a data-eye for data transferred at the initial stage among data of the data packet is smaller than that of subsequent data due to noise or the like. For example, when data of a data packet including 100 data are successively transmitted, a data-eye for three data transferred at the initial stage is smaller than a data-eye for subsequent 97 data. In this case, data recognition may not be properly performed.

SUMMARY

An embodiment of the present invention is directed to an integrated chip capable of preventing a data recognition error caused by reduction in data-eye of data transferred at the initial stage among data which are successively transferred, and a system having the same.

In accordance with an embodiment of the present invention, an integrated circuit chip includes: an internal circuit; a data output circuit configured to output a data packet of the internal circuit in response to a strobe signal; an oscillator configured to generate a first clock signal; a divider configured to divide the first clock signal and generate a second clock signal; and a strobe signal supply unit configured to supply the second clock signal as the strobe signal during an initial period of transmission of the data packet and supply the first clock signal as the strobe signal after the initial period.

In accordance with another embodiment of the present invention, an integrated circuit chip includes: an internal circuit; an output circuit configured to output a data packet of the internal circuit in response to a strobe signal; a first oscillator configured to generate a first clock signal; a second oscillator configured to generate a second clock signal having a lower frequency than the first clock signal; and a strobe signal supply unit configured to supply the second clock signal as the strobe signal during an initial period of transmission of the data packet, and supply the first clock signal as the strobe signal after the initial period.

In accordance with yet another embodiment of the present invention, an integrated circuit chip includes: an internal circuit; a data output circuit configured to output a data packet of the internal circuit in response to a strobe signal; an oscillator configured to generate the strobe signal having a frequency corresponding to a bias voltage; and a bias voltage generation unit configured to generate the bias voltage at a first voltage level during an initial period of transmission of the data packet and generate the bias voltage at a second voltage level higher than the first voltage level after the initial period.

In accordance with still another embodiment of the present invention, an integrated circuit includes: an internal circuit; a data output circuit configured to output a data packet of the internal circuit in response to a strobe signal; an oscillator configured to generate the strobe signal having a frequency corresponding to a bias voltage; and a bias voltage generation unit configured to generate the bias voltage at a voltage level that gradually increases during an initial period of transmission of the data packet and remains at constant voltage level after the initial period.

In accordance with still another embodiment of the present invention, a system includes: a first chip; a second chip; and a data channel between the first and second chips, wherein the first chip includes: a first internal circuit; a first data output circuit configured to output a first data packet of the first internal circuit to the data channel in response to a strobe signal; an oscillator configured to generate a first clock signal; a divider configured to divide the first clock signal and generate a second clock signal; and a strobe signal supply unit configured to supply the second clock signal as the strobe signal during an initial period of a transmission period of the first data packet and supply the first clock signal as the strobe signal after the initial period.

In accordance with still another embodiment of the present invention, a system includes: a first chip; a second chip; and a data channel between the first and second chips, wherein the first chip includes: an internal circuit; a data output circuit configured to output a data packet of the internal circuit to the data channel in response to a strobe signal; a first oscillator configured to generate a first clock signal; a second oscillator configured to generate a second clock signal having a lower frequency than the first clock signal; and a strobe signal supply unit configured to supply the second clock signal as the strobe signal during an initial period of transmission of the data packet and supply the first clock signal as the strobe signal after the initial period.

In accordance with still another embodiment of the present invention, a system includes: a first chip; a second chip; and a data channel between the first and second chips, wherein the first chip includes: an internal circuit; a data output circuit configured to output a data packet of the internal circuit to the data channel in response to a strobe signal; an oscillator configured to generate the strobe signal having a frequency corresponding to a bias voltage; and a bias voltage generation unit configured to generate the bias voltage at a first voltage level during an initial period of transmission of the data packet and generate the bias voltage at a second voltage level higher than the first voltage level after the initial period.

In accordance with still another embodiment of the present invention, a system includes: a first chip; a second chip; and a data channel between the first and second chips, wherein the first chip includes: an internal circuit; a data output circuit configured to output a data packet of the internal circuit to the data channel in response to a strobe signal; an oscillator configured to generate the strobe signal having a frequency corresponding to a bias voltage; and a bias voltage generation unit configured to generate the bias voltage that gradually increases during an initial period of a transmission period of the data packet and remains at a constant voltage level after the initial period.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
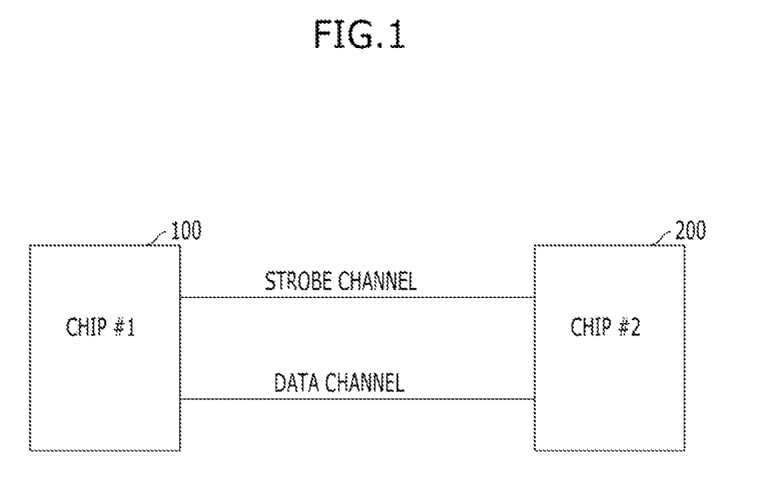
FIG. 1 is a configuration diagram of a system including first and second chips in accordance with an embodiment of the present invention.

FIG. 1 is a configuration diagram of a system including first and second chips in accordance with an embodiment of the present invention.

Referring to FIG. 1, the system in accordance with the embodiment of the present invention includes a first chip 100, a second chip 200, a data channel DATA CHANNEL, and a strobe channel STROBE CHANNEL.

The first and second chips 100 and 200 refer to integrated circuits (ICs) exchanging data through the data channel DATA CHANNEL. The first and second chips 100 and 200 may include any ICs such as CPU, GPU, DRAM, flash memory, and memory controller, which transmit and receive data.

Through the data channel DATA CHANNEL, the first and second chips 100 and 200 exchange data with each other. FIG. 1 illustrates one data channel DATA CHANNEL, but the system may include a plurality of data channels. For example, 32 data channels may be provided between a graphic DRAM and a GPU, and eight data channels may be provided between a flash memory and a flash controller.

Through the strobe channel STROBE CHANNEL, a signal to strobe data transmitted to the data channel DATA CHANNEL is transmitted. The signal to strobe data may include a system clock signal, and a dedicated signal to strobe data may be used in addition to the system clock signal.

Hereinafter, the term "data packet" is used to refer to a bundle of data successively transferred through the data channel DATA CHANNEL. During a program/read operation of a flash memory, about 500 bits of data are successively transferred to one data channel DATA CHANNEL. In this case, the 500 bits of data form one data packet. Furthermore, in the case of DRAM operating at a burst length (BL) of eight, eight data bits are successively transferred to one data channel DATA CHANNEL in response to one read command, and (number of successively-applied read commands)*eight data bits are successively transferred in response to the successively-applied read commands. In this case, (number of successively-applied read commands)*eight corresponds to the number of data bits forming one data packet.

As described above in the background, when data are transferred through the data channel DATA CHANNEL, the data-eye for data (e.g., a time window for detecting data) transferred at the initial stage is reduced more than the data-eye of subsequent data. In order to address such a feature, data may be transferred at a low rate during the initial period and transferred at a high rate after the initial period, when transferred through the data channel.

Figure 2A:
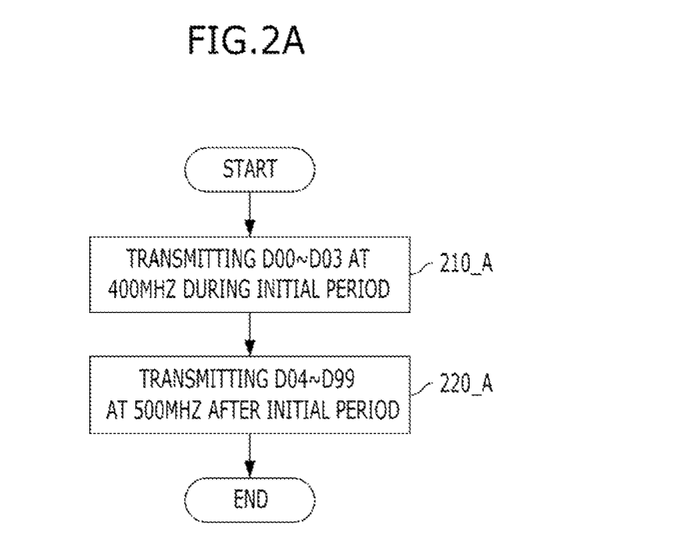
FIGS. 2A and 2B are flow charts showing data transmission methods in accordance with the embodiment of the present invention.
Figure 2B:
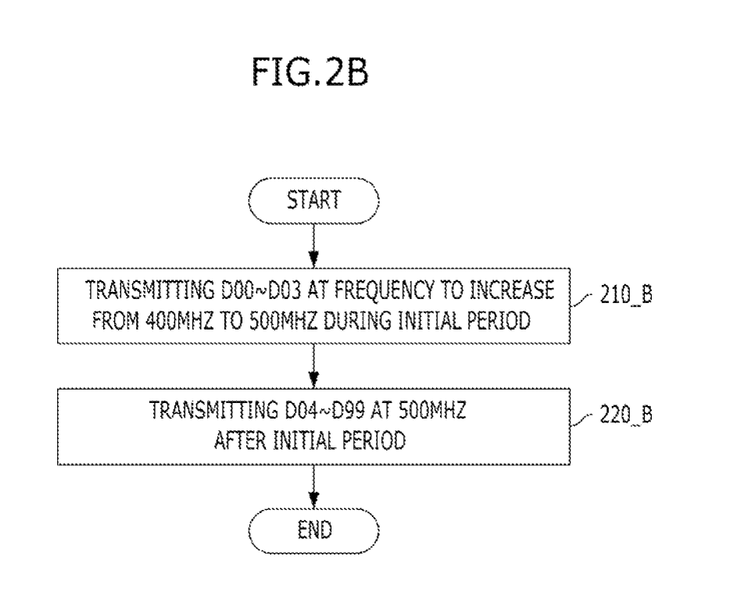

FIGS. 2A and 2B are flow charts showing data transmission methods in accordance with the embodiment of the present invention. Referring to FIG. 2A, some data bits D00 to D03 among data bits D00 to D09 of a data packet may be transmitted at a low frequency of 400 Mhz during the initial period of data packet transmission at step S210_A, and data bits D04 to D99 may be transmitted at a high frequency of 500 Mhz after the initial period. Furthermore, referring to FIG. 2B, some data bits D00 to D03 among data bits D00 to D99 of a data packet may be transmitted at a frequency that gradually increases from 400 Mhz to 500 Mhz during the initial period (for example, first to five cycles) of data packet transmission at step S210_B, and data bits D04 to D99 may be transmitted at a high frequency of 500 Mhz after the initial period.

The method of FIG. 2A or 2B in which the data transmission rate of the initial period is set differently from the data transmission rate after the initial period may be used in both of the first and second chips 100 and 200 or used in any one of the first and second chips 100 and 200.

In FIGS. 2A and 2B, a case in which 100 data bits form a data packet and four data bits are transferred during the initial period has been taken as an example. Furthermore, the low frequency was set to 400 Mhz, and the high frequency was set to 500 Mhz. However, this is exemplary only, and the numbers may be changed according to design needs.

The length of the initial period may be set according to a period of a data-eye designed to avoid malfunctions when a data packet is transmitted. For example, when 100 data bits are transmitted, the size of a data-eye may be reduced for two data bits transmitted at the initial stage. In this case, the length of the initial period may be set to a period where two data bits are transmitted.

Furthermore, a difference between the high frequency and the low frequency may be set based on a difference between the size of the data-eye of data transmitted during the initial period and the size of the data-eye of data transmitted after the initial period. For example, when the data-eye of the data transmitted during the initial period is smaller by 20% than the data-eye of the data transmitted after the initial period, the difference between the high frequency and the low frequency may be set to 20%.

Figure 3:
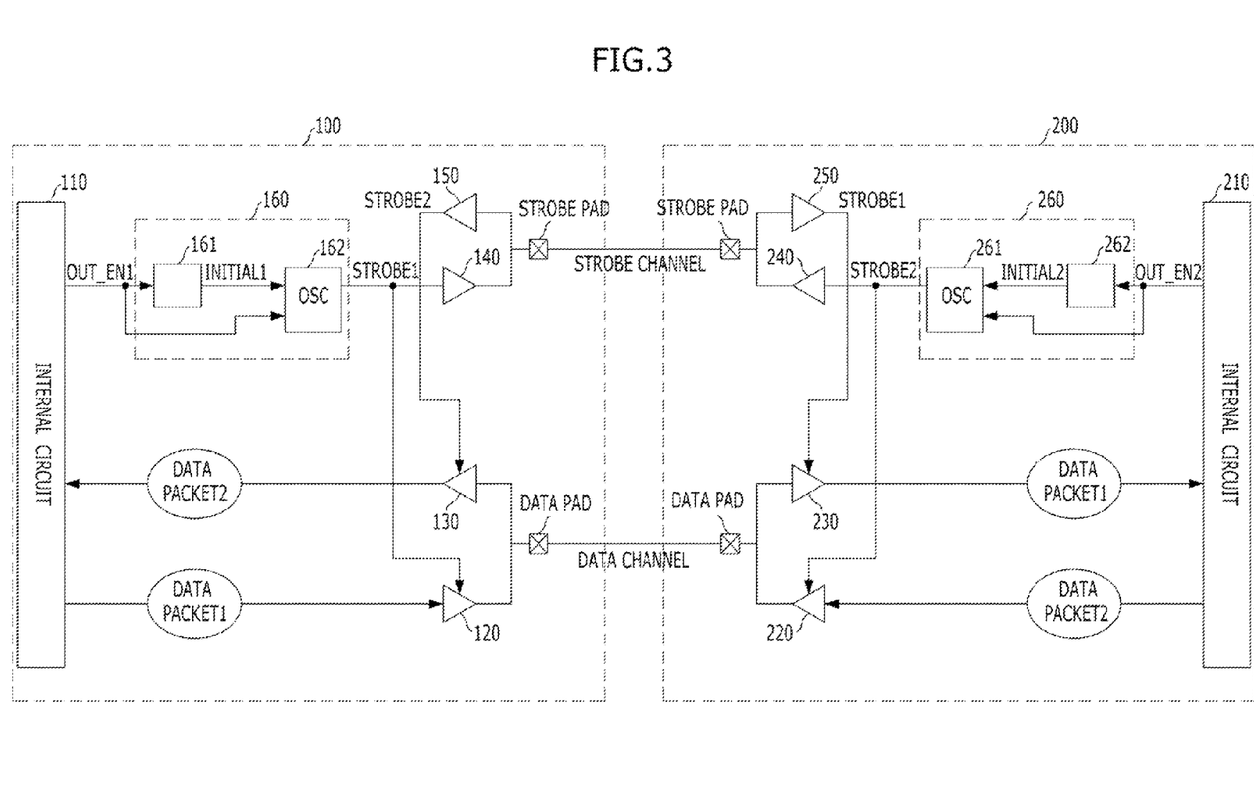
FIG. 3 is a diagram illustrating a first example of the first and second chips.

FIG. 3 is a diagram Illustrating a first example of the first and second chips 100 and 200.

Referring to FIG. 3, the first chip 100 includes an internal circuit 110, a data output circuit 120, a data input circuit 130, a strobe output circuit 140, a strobe input circuit 150, and a strobe signal generator 160.

The internal circuit 110 is a circuit to perform an operation of the first chip 100. When the first chip 100 is a memory, the internal circuit 110 may include a circuit to store data and a circuit to control the circuit, and when the first chip 100 is a CPU, the internal circuit 110 may include a circuit to perform various operations and a circuit to control the circuit. Furthermore, when the first chip 100 is a memory controller, the internal circuit 110 may include various logic circuits to control a memory. In this case, the second chip 200 may be the memory.

The strobe signal generator 160 is configured to generate a strobe signal STROBE1 in response to an output enable signal OUT_EN1. The output enable signal OUT_EN1 indicates a period where the first chip 100 outputs a data packet DATA PACKET1 and is generated by the internal circuit 110.

The strobe signal generator 160 may include an initial period signal generation unit 161 and a periodic wave generation unit 162. The initial period signal generation unit 161 is configured to generate an initial period signal INITIAL1 which is activated during an initial activation period of the output enable signal OUT_EN1. The periodic wave generation unit 162 is configured to generate the strobe signal STROBE1 in response to the output enable signal OUT_EN1 and the initial period signal INITIAL1.

The periodic wave generation unit 162 may generate the strobe signal STROBE1 according to the following two cases. (1) The periodic wave generation unit 162 may generate the strobe signal STROBE1 in a period where the first chip 100 outputs a data packet, that is, the activation period of the output enable period OUT_EN1. In this case, the strobe signal STROBE1 is generated at a low frequency in the initial period of the transmission period of the data packet (that is, period where the initial period signal OUT_EN1 is activated) and generated at a high frequency in a period after the initial period (that is, period where the initial period INITIAL1 is deactivated). (2) The period wave generation unit 162 may generate the strobe signal STROBE1 in a period where the first chip 100 outputs a data packet, that is, the activation period of the output enable period OUT_EN1. In this case, the strobe signal STROBE1 is generated at a frequency that gradually increases in the initial period of the transmission period of the data packet (that is, period where the initial period signal OUT_EN1 is activated) and generated at a high frequency (that is, a higher frequency) in a period after the initial period (that is, period where the initial period INITIAL1 is deactivated).

The data output circuit 120 is configured to output the data packet DATA PACKET1, output from the internal circuit 110, to a data pad DATA PAD. The data output circuit 120 is strobed by the strobe signal STROBE1, and outputs data of the data packet DATA PACKET1. Therefore, the data output circuit 120 outputs data at a low rate during the Initial period of the transmission period of the data packet DATA PACKET1, and outputs data at a high rate after the initial period.

The strobe input circuit 150 is configured to receive a strobe signal STROBE2 transmitted from the second chip 200 to the first chip 100 and transfer the received strobe signal STROBE2 to the data input circuit 130. The data input circuit 130 is strobed by the strobe signal STROBE2 and receives data of a data packet DATA PACKET2 from the second chip 200 transmitted to the first chip 100.

Since internal components 210, 220, 230, 240, 250, and 260 of the second chip 200 may be configured in the same manner as the internal components of the first chip 100, the detailed descriptions thereof are omitted herein.

Referring to FIG. 3, when the first chip 100 transmits data to the second chip 200, the first chip 100 generates the strobe signal STROBE1 for strobing the data of the data channel DATA CHANNEL. Furthermore, when the second chip 200 transmits data to the first chip 100, the second chip 200 generates a strobe signal for strobing the data of the data channel DATA CHANNEL. That is, according to the configuration of FIG. 3, a transmission-side chip generates a strobe signal and transmits a data packet using the generated strobe signal, and a reception-side chip receives the data packet.

Figure 4:
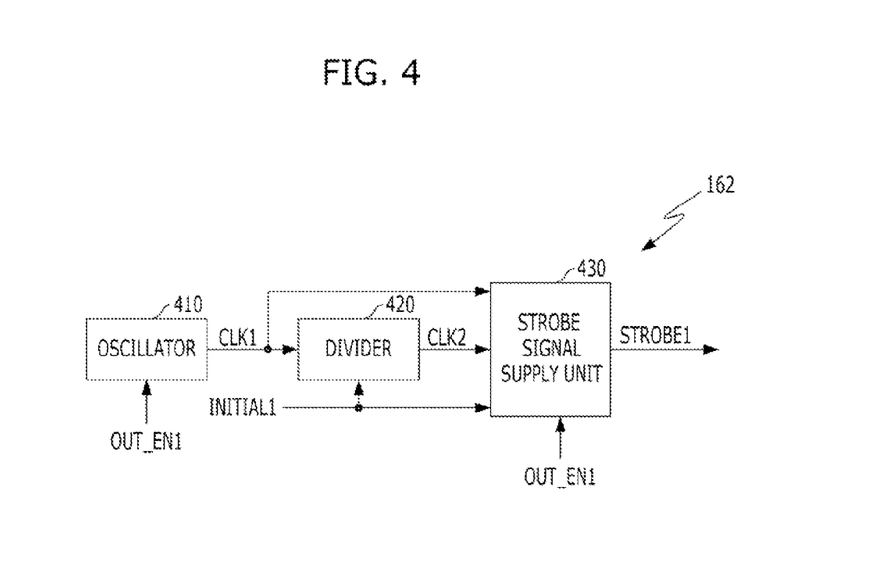
FIG. 4 is a configuration diagram illustrating a first example of a periodic wave generation unit.

FIG. 4 is a configuration diagram Illustrating a first example of the periodic wave generation unit 162.

Referring to FIG. 4, the periodic wave generation unit 162 includes an oscillator 410, a divider 420, and a strobe signal supply unit 430.

The oscillator 410 is configured to generate a first clock signal CLK1 having a predetermined frequency (for example, 250 Mhz). In order to reduce power consumption of the oscillator 420, the oscillator 420 may be designed to be disabled while the first chip 100 does not output data (that is, the output enable signal OUT_EN1 is deactivated). Alternatively, the oscillator 410 may be designed to be turned on at all times.

The divider 420 is configured to divide the first clock signal CLK1 and generate a second clock signal CLK2 having a lower frequency (for example, 125 Mhz) than the first clock signal CLK1. In order to reduce power consumption of the divider 420, the divider 420 may be designed to be enabled/disabled in response to the output enable signal OUT_EN or the initial period signal INITIAL1. FIG. 4 illustrates that the divider 420 is enabled during the activation period of the initial period signal INITIAL1. Alternatively, the divider 420 may be designed to be turned on at all times.

The strobe signal supply unit 430 is configured to supply the first clock signal CLK1 as the strobe signal STROBE1 during the initial period of the transmission period of the data packet (that is, while the initial period signal INITIAL1 is activated). Furthermore, the strobe signal supply unit 430 is configured to supply the second clock signal CLK2 as the strobe signal STROBE1 during a period after the initial period of the transmission period of the data packet (that is, while the initial period signal INITIAL1 is deactivated). The strobe signal supply unit 430 may be designed to be enabled/disabled in response to the output enable signal OUT_EN1.

Figure 5:
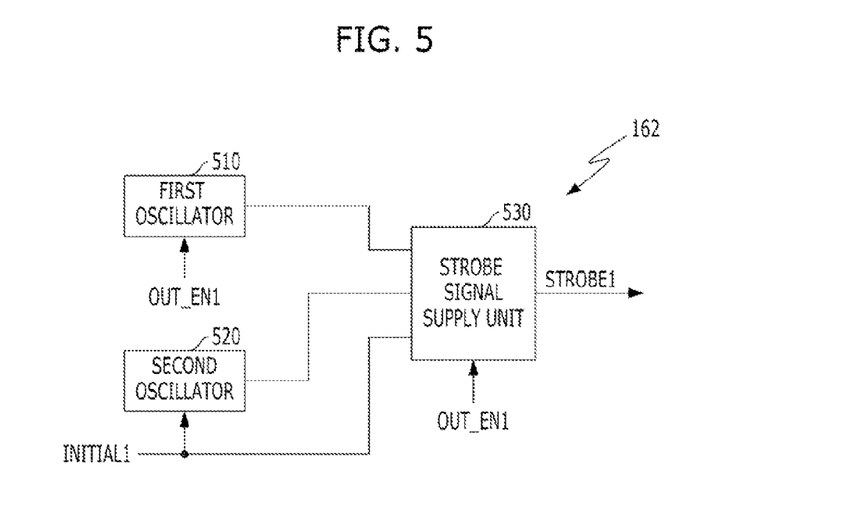
FIG. 5 is a configuration diagram illustrating a second example of the periodic wave generation unit.

FIG. 5 is a configuration diagram Illustrating a second example of the periodic wave generation unit 162.

Referring to FIG. 5, the periodic wave generation unit 162 includes a first oscillator 510, a second oscillator 520, and a strobe signal supply unit 530.

The first oscillator 510 is configured to generate a first clock signal CLK1 having a higher frequency (for example, 250 Mhz) than a second clock signal CLK2. In order to reduce power consumption of the first oscillator 510, the first oscillator 510 may be designed to be disabled while the first chip 100 does not output data (that is, while the output enable signal OUT_EN1 is deactivated). Alternatively, the first oscillator 510 may be designed to be turned on at all times.

The second oscillator 520 is configured to generate a second clock signal CLK2 having a lower frequency (for example, 200 Mhz) than the first clock signal CLK1. In order to reduce power consumption of the second oscillator 520, the second oscillator 520 may be designed to be enabled/disabled in response to the output enable signal OUT_EN or the initial period signal INITIAL1.

The strobe signal supply unit 530 is configured to supply the first clock signal CLK1 as the strobe signal STROBE1 during the initial period of the transmission period of the data packet (that is, while the initial period signal INITIAL1 is activated). Furthermore, the strobe signal supply unit 530 is configured to supply the second clock signal CLK2 as the strobe signal STROBE1 during a period after the initial period of the data packet transmission period (that is, while the Initial period signal INITIAL1 is deactivated). The strobe signal supply unit 530 may be designed to be enabled/disabled in response to the output enable signal OUT_EN1.

Figure 6:
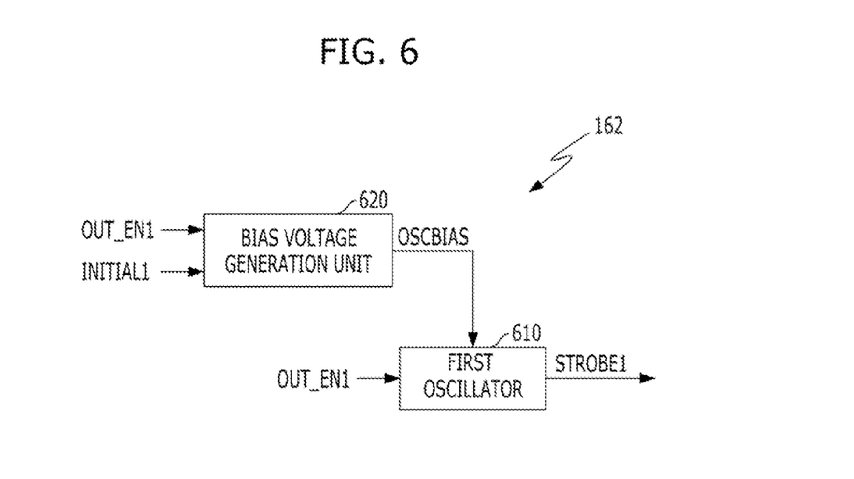
FIG. 6 is a configuration diagram illustrating a third example of the periodic wave generation unit.

FIG. 6 is a configuration diagram Illustrating a third example of the periodic wave generation unit 162.

The period wave generation unit 162 includes an oscillator 610 and a bias voltage generation unit 620.

The oscillator 610 is configured to generate the strobe signal STROBE1 having a frequency corresponding to an inputted bias voltage OSCBIAS. As the bias voltage OSCBIAS increases, the frequency of the strobe signal STROBE1 increases, and as the bias voltage OSCBIAS decreases, the frequency of the strobe signal STROBE1 decreases. The oscillator 610 may be any reasonably suitable voltage controlled oscillator (VCO). In order to reduce power consumption of the oscillator 610, the oscillator 610 may be designed to be disabled while the first chip 100 does not output data (that is, while the output enable signal OUT_EN1 is deactivated).

The bias voltage generation unit 620 is configured to generate the bias voltage OSCBIAS and supply the generated bias voltage OSCBIAS to the oscillator 610. The bias voltage generation unit 620 may be designed to generate the bias voltage OSCBIAS according to one of the following two cases. (1) The bias voltage generation unit 620 may generate the bias voltage OSCBIAS in a period where the first chip 100 outputs data (that is, the activation period of the output enable signal OUT_EN1). In this case, the bias voltage OSCBIAS is generated at a low level in the initial period of the data packet transmission period (that is, the activation period of the initial period signal INITIAL1), and generated at a high level after the initial period. (2) The bias voltage generation unit 620 may generate the bias voltage OSCBIAS in a period where the first chip 100 outputs data (that is, the activation period of the output enable signal OUT_EN1). In this case, the bias voltage OSCBIAS is generated at a level that gradually increases in the initial period of the transmission period of the data packet (that is, the activation period of the initial period signal INITIAL1) and generated at a high level (for example, a higher constant voltage level) after the initial period.

When the bias voltage generation unit 620 is designed according to the first case (1), the bias voltage generation unit 162 may satisfy the first case (1). Furthermore, when the bias voltage generation unit 620 is designed according to the second case (2), the bias voltage generation unit 620 may satisfy the second case (2). In order to reduce power consumption of the bias voltage generation unit 620, the bias voltage generation unit 620 may be designed to be enabled/disabled in response to the output enable signal OUT_EN1.

Figure 7A:
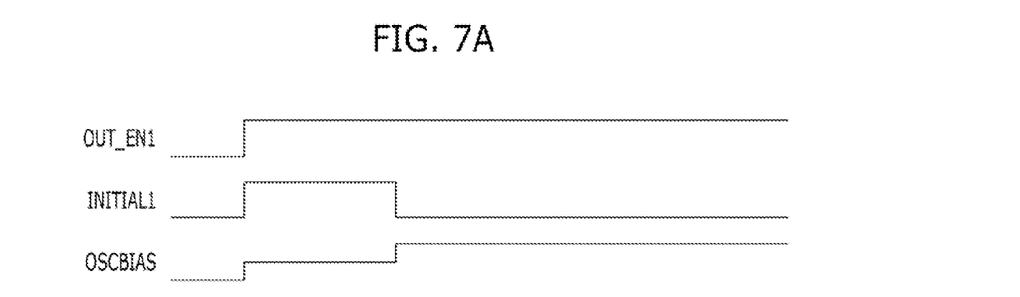
FIGS. 7A and 7B are diagrams illustrating the level of a bias voltage generated by a bias voltage generation unit.
Figure 7B:
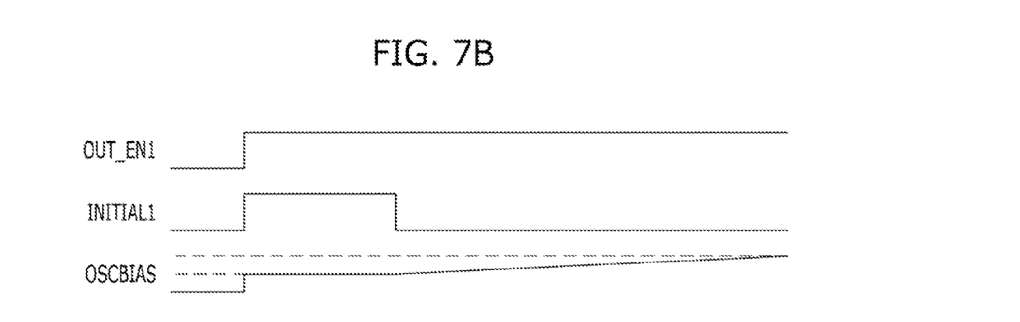

FIGS. 7A and 7B Illustrate the level of the bias voltage OSCBIAS generated by the bias voltage generation unit 620 when the bias voltage generation unit 620 is designed according to the first and second cases (1) and (2), respectively.

Figure 8A:
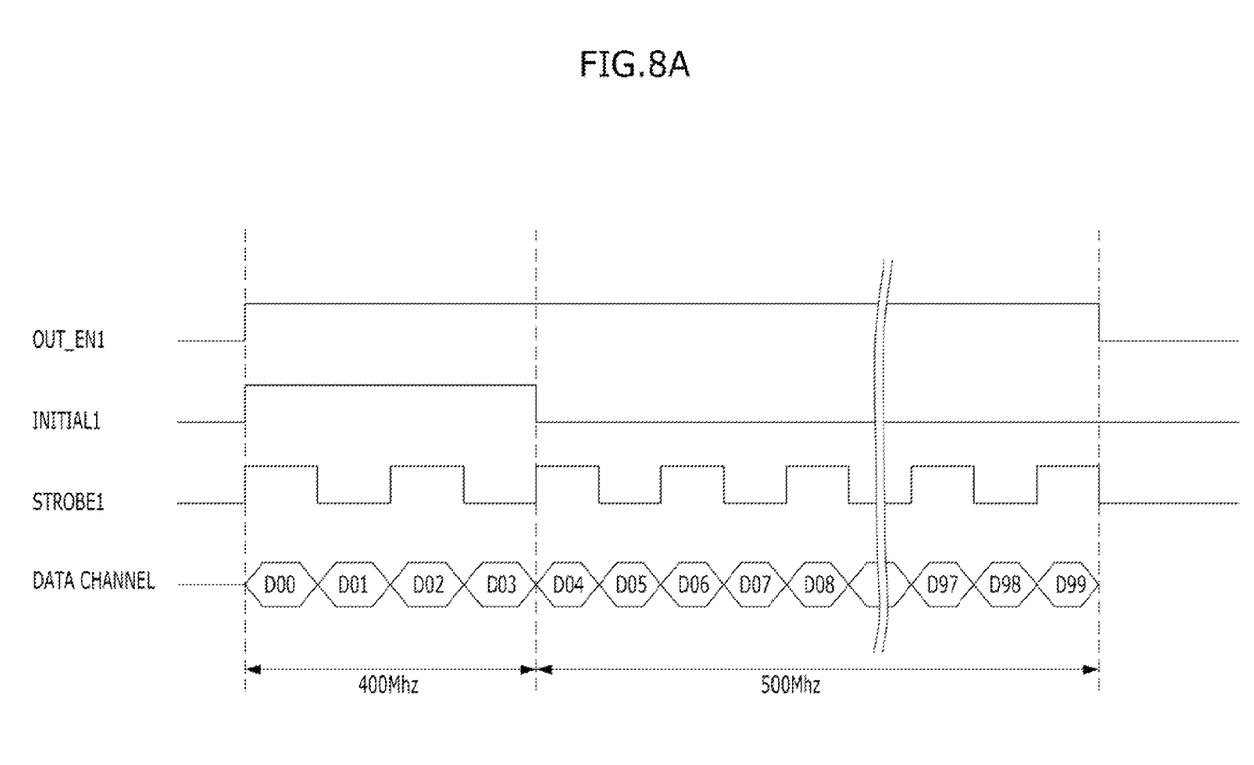
FIGS. 8A and 8B are timing diagrams illustrating that a data packet is transmitted from the first chip to the second chip as described with reference to FIGS. 2 to 7.
Figure 8B:
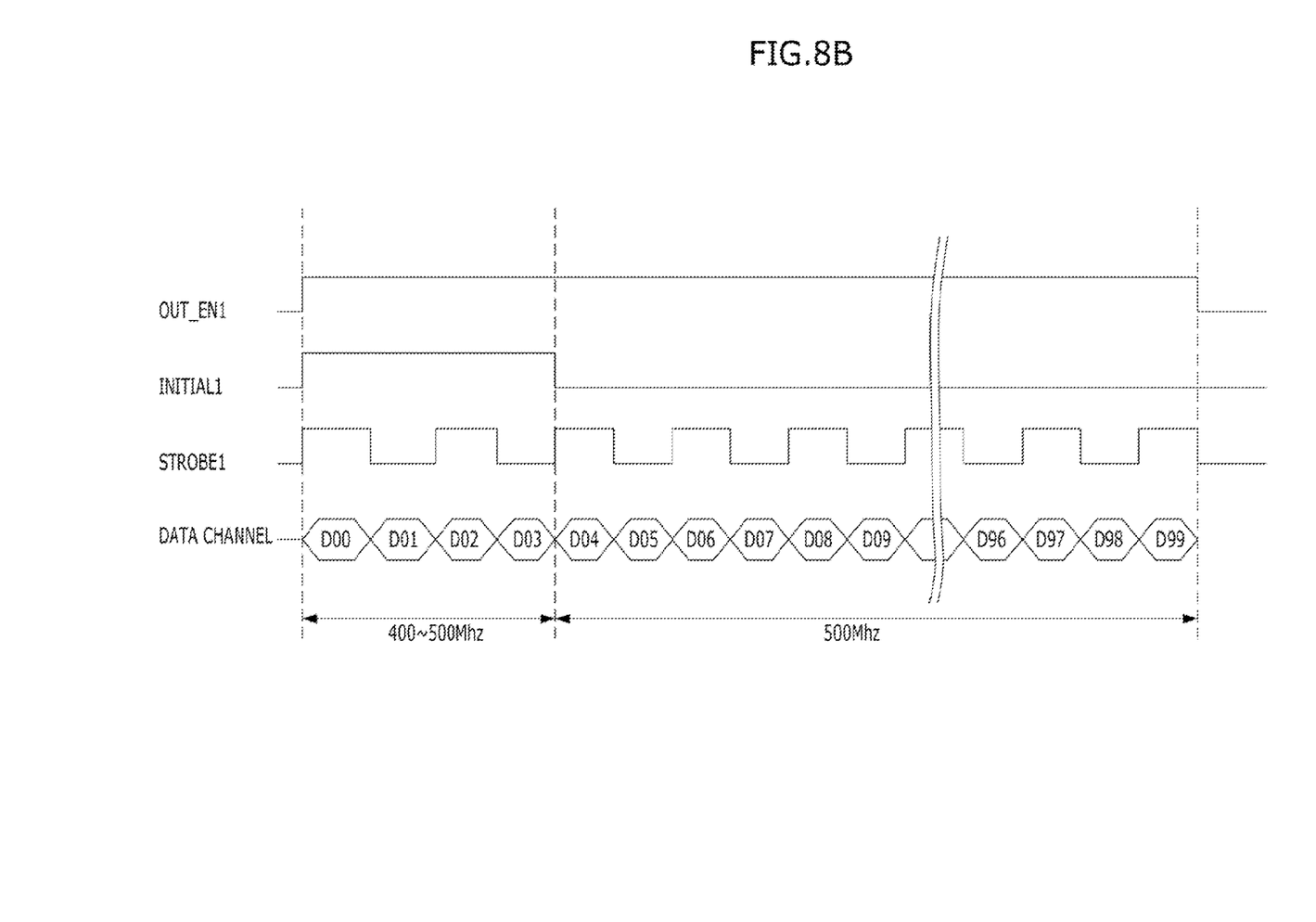

FIGS. 8A and 8B are timing diagrams illustrating that a data packet is transmitted from the first chip 100 to the second chip 200 as described with reference to FIGS. 2 to 7. FIG. 8A illustrates that the data packet is transmitted according to the method of FIG. 2A, and FIG. 8B illustrates that the data packet is transmitted according to the method of FIG. 2B. Furthermore, FIGS. 8A and 8B illustrate that the data packet includes 100 data bits.

Referring to FIG. 8A, the output enable signal OUT_EN1 is activated to a high level while the data packet DATA PACKET1 is outputted from the first chip 100, and the initial period signal INITIAL1 is activated to a high level during the initial period of the activation period of the output enable signal OUT_EN. The strobe signal STROBE1 toggles at a frequency of 200 Mhz while the initial period signal INITIAL1 is activated and toggles at a frequency of 250 Mhz while the initial period signal INITIAL1 is deactivated. The data output circuit 120 of the first chip 100 outputs data bits D00 to D09 of the data packet in response to the strobe signal STROBE1. Four data bits D00 to D03 outputted during the initial period are outputted in high periods and low periods of the strobe signal STROBE1 toggling at 200 Mhz. That is, the four data bits D00 to D03 outputted during the initial period are outputted at a rate of 400 Mhz. Since the other data bits D04 to D99 outputted after the initial period are outputted in high periods and low periods of the strobe signal STORBE1 toggling at 250 Mhz, the data bits D04 to D99 are outputted at a rate of 500 Mhz. The data input circuit 230 of the second chip 200 receives the data packet D00 to D99 in response to the strobe signal STROBE1.

Referring to FIG. 8B, the output enable signal OUT_EN1 is activated to a high level while the data packet DATA PACKET1 is outputted from the first chip 100, and the initial period signal INITIAL1 is activated to a high level during the initial period of the activation period of the output enable signal OUT_EN1. The strobe signal STROBE1 toggles at a frequency to increase from 200 Mhz to 250 Mhz while the initial period signal INITIAL1 is activated and toggles at a frequency of 250 Mhz while the initial period signal INITIAL1 is deactivated. The data output circuit 120 of the first chip 100 outputs data bits D00 to D99 of the data packet in response to the strobe signal STROBE1. Four data bits D00 to D03 outputted during the initial period are outputted in high periods and low periods of the strobe signal STROBE1 toggling at a frequency to increase from 200 Mhz to 250 Mhz. That is, the four data bits D00 to D03 outputted during the initial period are outputted at a rate that increases from 400 Mhz to 500 Mhz. Since the other data bits D04 to D99 outputted after the initial period are outputted in high periods and low periods of the strobe signal STROBE1 toggling at a frequency of 250 Mhz, the data bits D04 to D99 are outputted at a rate of 500 Mhz. The data input circuit 230 of the second chip 200 receives the data packet D00 to D09 in response to the strobe signal STROBE1.

Figure 9:
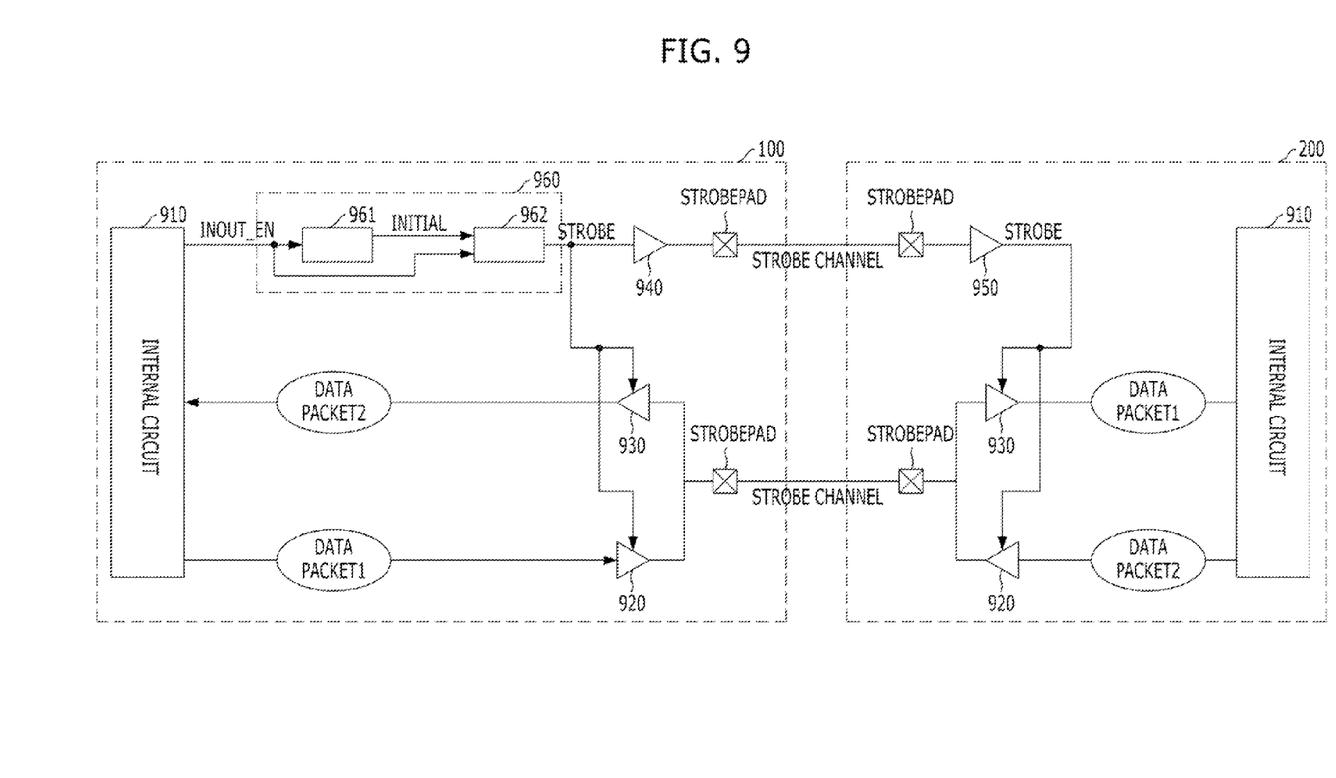
FIG. 9 is a configuration diagram Illustrating a second example of the first and second chips.

FIG. 9 is a configuration diagram illustrating a second example of the first and second chips 100 and 200.

While FIG. 3 illustrates a case in which when data are transmitted from the first chip 100 to the second chip 200, the first chip 100 generates the strobe signal STROBE1, and when data are transmitted from the second chip 200 to the first chip 100, the second chip 200 generates the strobe signal STROBE2, FIG. 9 illustrates a case in which, for example, only one chip 100 of the two chips generates a strobe signal STROBE.

The first chip 100 includes an internal circuit 910, a data output circuit 920, a data input circuit 930, a strobe output circuit 940, and a strobe signal generator 960.

The internal circuit 910 is a circuit to perform the operation of the first chip 100. When the first chip 100 is a memory, the internal circuit 910 may include a circuit to store data and a circuit to control the storage circuit, and when the first chip 100 is a CPU, the internal circuit 910 may include a circuit to perform various operations and a circuit to control the operation circuit. Furthermore, when the first chip 100 is a memory controller, the internal circuit 910 may include various logics to control a memory. In this case, the second chip 200 may be set to the memory.

The strobe signal generator 960 is configured to generate a strobe signal STROBE in response to an input/output enable signal INOUT_EN. The Input/output enable signal INOUT_EN indicates a period where the first chip 100 outputs a data packet DATA PACKET1 and a period where the second chip 200 outputs a data packet DATA PACKET2 (that is, period where the first chip 100 receives the data packet DATA PACKET2), and the input/output enable signal INOUT_EN is generated by the internal circuit 960. That is, the strobe signal generator 960 generates the strobe signal STROBE not only in a period where data are transmitted from the first chip 100 to the second chip 200 but also in a period where data are transmitted from the second chip 200 to the first chip 100.

The strobe signal generator 960 may includes an initial period signal generation unit 961 and a periodic wave generation unit 962. The initial period signal generation unit 961 is configured to generate an initial period signal INITIAL, which is activated during the initial activation period of the input/output enable signal INOUT_EN. The periodic wave generation unit 962 is configured to generate the strobe signal STROBE in response to the input/output enable signal INOUT_EN and the initial period signal INITIAL. The periodic generation unit 962 may be configured in the same manner as described with reference to FIGS. 4 to 7. In this case, however, the output enable signal OUT_EN1 of FIGS. 4 to 7 may be replaced with the input/output enable signal INOUT_EN, and the initial period signal INITIAL1 may be replaced with the initial signal INITIAL.

The data output circuit 920 is configured to output the data packet DATA PACKET1, which the internal circuit 910 is to output to the outside of the first chip 100, to a data pad DATA PAD. The data output circuit 920 is strobed by the strobe signal STROBE, and outputs data of the data packet DATA PACKET1. Therefore, the data output circuit 920 outputs data at a low rate during the initial period of the transmission period of the data packet DATA PACKET1 and outputs data at a high rate after the initial period.

The data input circuit 930 is strobed by the strobe signal STROBE and receives data of the data packet DATA PACKET2 transmitted to the first chip 100 from the second chip 200.

The second chip 200 includes an internal circuit 910, a data output circuit 920, a data input circuit 930, and a strobe input circuit 950. The second chip 200 uses the strobe signal STROBE received from the first chip 100 through the strobe input circuit 950 during data input/output operation. Here, the second chip 200 does not generate a strobe signal, and both of the data output circuit 920 and the data input circuit 910 use the strobe signal STROBE transferred from the first chip 100.

In accordance with the embodiments of the present invention, some data of a data packet are transmitted at a low frequency during the initial period of the transmission period of the data packet, and the other data of the data packet are transmitted at a high frequency after the initial period. Therefore, an error of the initial period may be prevented.

Furthermore, since a problem occurring in the initial period of the data transmission may be solved, data may be transmitted at a higher rate after the initial period. As a result, the transmission rate may be increased.

While the present invention has been described with respect to the specific embodiments, it will be apparent to those skilled in the art that various changes and modifications may be made without departing from the spirit and scope of the invention as defined in the following claims.

What is claimed is:

1. An integrated circuit chip comprising:
   an internal circuit;
   a data output circuit configured to output a data packet of the internal circuit in response to a strobe signal;
   an oscillator configured to generate the strobe signal having a frequency corresponding to a bias voltage; and
   a bias voltage generation unit configured to generate the bias voltage at a first voltage level during an initial period of transmission of the data packet and generate the bias voltage at a second voltage level higher than the first voltage level after the initial period.

2. The integrated circuit chip of claim 1, wherein the oscillator is configured to generate the strobe signal having a high frequency as the bias voltage level increases.

3. The integrated circuit chip of claim 1, wherein the oscillator is configured to be turned on during the transmission of the data packet.

4. The integrated circuit chip of claim 1, wherein the internal circuit is configured to generate an output enable signal indicating the transmission period of the data packet,
   the integrated circuit chip further comprises an initial period generation unit configured to generate an initial period signal that is activated during an initial activation period of the output enable signal, and
   the bias voltage generation unit is configured to generate the bias voltage at the first voltage level while the initial period signal is activated.

5. An integrated circuit comprising:
   an internal circuit;
   a data output circuit configured to output a data packet of the internal circuit in response to a strobe signal;
   an oscillator configured to generate the strobe signal having a frequency corresponding to a bias voltage; and
   a bias voltage generation unit configured to generate the bias voltage at a voltage level that gradually increases during an initial period of transmission of the data packet and remains at constant voltage level after the initial period.

6. The integrated circuit chip of claim 5, wherein the constant voltage level is equal to a final bias voltage level of the initial period.

7. The integrated circuit chip of claim 5, wherein the oscillator is configured to be enabled during the transmission of the data packet.

8. The integrated circuit chip of claim 5, wherein the internal circuit is configured to generate an output enable signal indicating the transmission of the data packet,
   the integrated circuit further comprises an initial period signal generation unit configured to generate an initial period signal that is activated during an initial activation period of the output enable signal, and
   the bias voltage generation unit is configured to generate the bias voltage that gradually increases while the initial period signal is activated.

9. A system comprising:
   a first chip;
   a second chip; and
   a data channel between the first and second chips,
   wherein the first chip comprises:
   an internal circuit;
   a data output circuit configured to output a data packet of the internal circuit to the data channel in response to a strobe signal;
   an oscillator configured to generate the strobe signal having a frequency corresponding to a bias voltage; and
   a bias voltage generation unit configured to generate the bias voltage at a first voltage level during an initial period of transmission of the data packet and generate the bias voltage at a second voltage level higher than the first voltage level after the initial period.

10. A system comprising:
a first chip;
a second chip; and
a data channel between the first and second chips,
wherein the first chip comprises:
an internal circuit;
a data output circuit configured to output a data packet of the internal circuit to the data channel in response to a strobe signal;
an oscillator configured to generate the strobe signal having a frequency corresponding to a bias voltage; and
a bias voltage generation unit configured to generate the bias voltage that gradually increase during an initial period of a transmission period of the data packet and remains at a constant voltage level after the initial period.

* * * * *